United States Patent [19]

McCartney et al.

[11] Patent Number: 4,725,739
[45] Date of Patent: Feb. 16, 1988

[54] AC BRANCH POWER DISTRIBUTION FILTER

[75] Inventors: Thomas McCartney, Bannockburn; Robert T. Thomas, Rolling Meadows, both of Ill.

[73] Assignee: Oneac Corporation, Libertyville, Ill.

[21] Appl. No.: 917,891

[22] Filed: Oct. 10, 1986

[51] Int. Cl.[4] .......................... H02J 1/00; H03H 7/00; H03H 7/09
[52] U.S. Cl. .......................................... 307/35; 307/91; 307/12; 307/13; 333/167; 333/177; 333/185
[58] Field of Search ........................ 307/35, 62, 91, 12, 307/13; 333/177, 167, 175, 176, 181, 24 R, 100, 185

[56] References Cited

U.S. PATENT DOCUMENTS 4,677,401 6/1987 Nonaka et al. ...................... 333/167

Primary Examiner—William M. Shoop, Jr.
Assistant Examiner—Sharon D. Logan
Attorney, Agent, or Firm—Mason, Kolehmainen Rathburn & Wyss

[57] ABSTRACT

An AC branch power distribution filter is provided for supplying AC power to a plurality of different load devices from a common external AC power source that eliminates the need for a separate protection device at each power outlet with the load devices. A plurality of elongate, flat conductors are coupled to the AC power source and include a neutral conductor, a ground conductor and at least one live conductor. The elongate flat conductors are parallel and spaced apart in an electrically insulated casing member. An electrically conductive shield member is electrically connected to the ground conductor and extends lengthwise of the elongate flat conductors overlying the insulative casing member. The shield member provides a shunt capacitance between ground potential and each of the live conductors and the neutral conductor. This distributed capacitance is utilized as the shunt element of the distribution filter. Transition filtering circuitry is connected between the plurality of elongate flat conductors and the common external AC power source. The transition filtering circuitry includes an inductance device connected in series with each of the live conductors and the neutral conductor.

20 Claims, 3 Drawing Figures

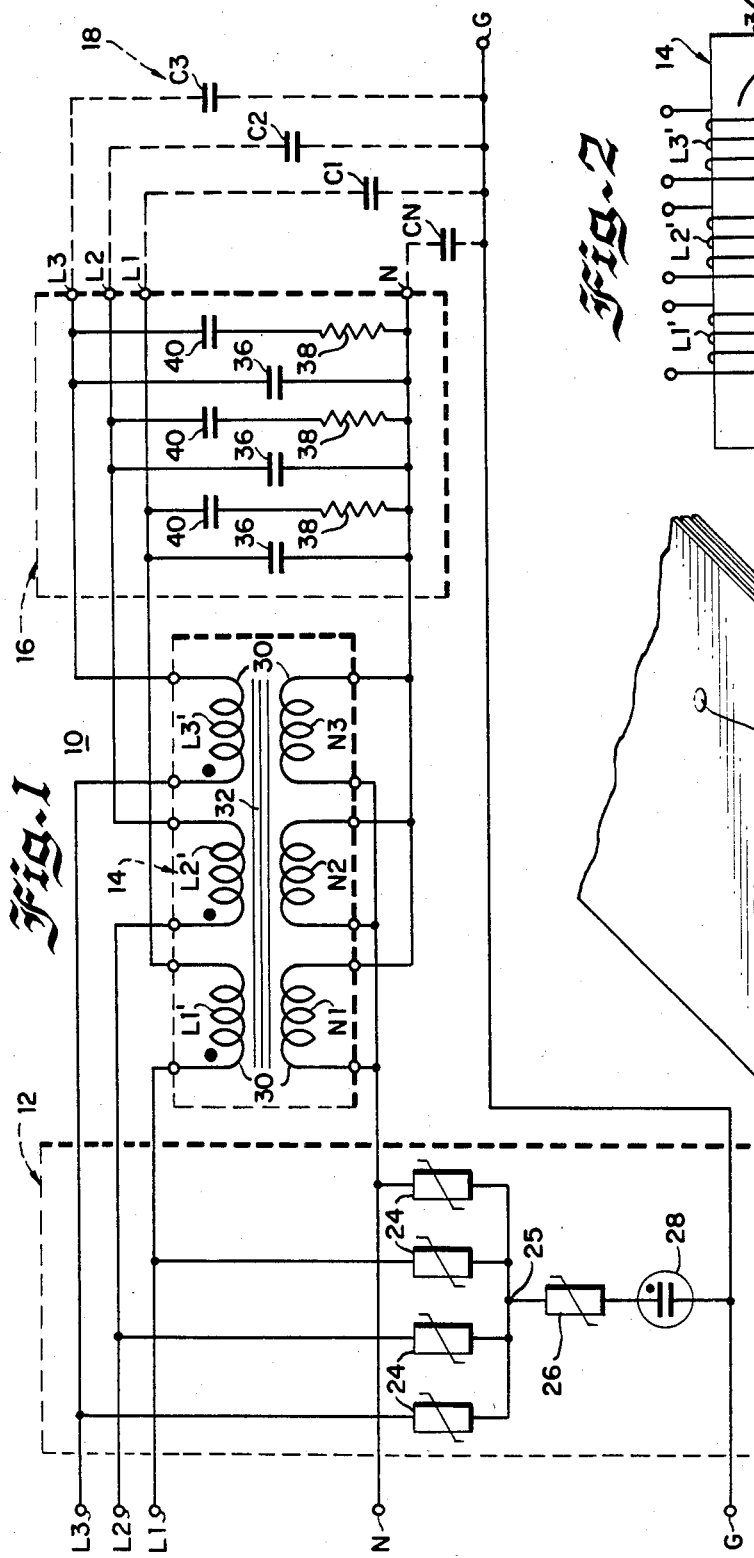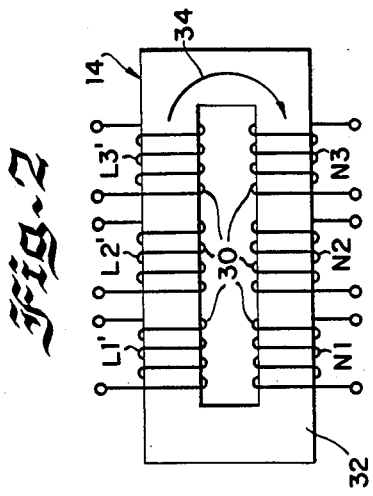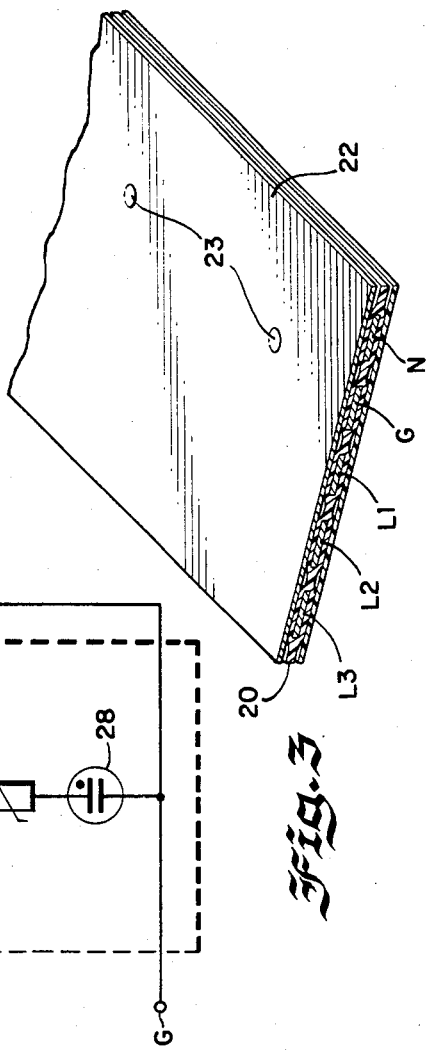

AC BRANCH POWER DISTRIBUTION FILTER

BACKGROUND OF THE INVENTION

1. Field of the Invention

This invention relates generally to circuitry for AC power line filtering and suppression and more particularly to such circuitry for protecting a plurality of different load devices connected to a branch distribution system supplied from a common external AC power source.

2. Description of the Prior Art

Various circuitry arrangements are known for protecting different load devices, such as computers and various office machines from noise and interference on the AC power supplied thereto. However, while such known arrangements may perform satisfactorily for the intended purpose, a separate protection device is typically required at each power outlet with the load device to be protected.

It is desirable to provide a single circuit that is effective for protecting a plurality of different load devices that are connected to an AC branch power system, thus avoiding the requirement for protection circuitry at each individual branch outlet. It is desirable also to provide such a circuit that minimizes interference and noise between the load devices.

SUMMARY OF THE INVENTION

Accordingly, it is a principal object of the present invention to provide a new and improved electrical filter for protecting a plurality of different load devices connected to an AC branch power distribution system supplied from a common external AC power source.

It is a further object of the present invention to provide such an electrical filter including transition filtering means connected between the common external AC power source and a plurality of elongate flat conductors that are connected to the different load devices.

It is another object of the present invention to provide an AC branch distribution network for supplying AC power to a plurality of different load devices.

It is another object of this invention to provide an improved power filtering and suppression circuit.

Briefly, these and other objects of the present invention are achieved by providing an AC branch power distribution filter for supplying AC power to a plurality of different load devices from a common external AC power source. A plurality of elongate, flat conductors are coupled to the AC power source and include a neutral conductor, a ground conductor and at least one live conductor. The elongate flat conductors are parallel and spaced apart in an electrically insulated casing member. An electrically conductive shield member is electrically connected to the ground conductor and extends lengthwise of the elongate flat conductors overlying the insulative casing member. The shield member provides a distributed shunt capacitance between ground potential and each of the live conductors and the neutral conductor. Transition filtering circuitry is connected between the plurality of elongate flat conductors and the common external AC power source. The transition filtering circuitry includes an inductance device connected in series with each of the live conductors and the neutral conductor.

BRIEF DESCRIPTION OF THE DRAWING

The above and other objects and advantages of the present invention will become apparent from the following detailed description of the preferred embodiment of the present invention illustrated in the accompanying drawing wherein:

FIG. 1 is an electrical schematic representation of an electrical filter and suppression circuit arranged in accordance with the principles of the present invention;

FIG. 2 is a ,partly schematic and plan view of an inductance device included in the filter and suppression circuitry of FIG. 1; and FIG. 3 is a perspective view of an electrical cable of the filter and suppression circuitry of FIG. 1.

DESCRIPTION OF THE PREFERRED EMBODIMENT

Referring now to the drawing wherein like reference characters are used for like parts throughout, there is illustrated in FIG. 1 an electrical filter and suppression circuit designated generally by the reference number 10 arranged in accordance with features of the invention. The circuit 10 is illustrated for use with a three phase external AC power source and includes live lines L1, L2 and L3, a neutral line N and a ground line G; however, circuit 10 may be adapted for use with a single phase or a two phase power source.

As its major component parts, the filter and suppression circuit 10 includes transient voltage suppressor circuitry 12, an inductance arrangement 14, a snubber filter circuitry 16 and a multiconductor cable 18. In accordance with an important feature of the invention, a distributed capacitance provided by the multiconductor cable 18 is utilized as a shunt filtering element of circuit 10. The distributed cable capacitance is shown in dotted line including distributed capacitance between neutral and ground conductors designated as CN and between live and ground conductors designated as C1, C2 and C3.

Multiconductor cable 18 includes a plurality of elongate, flat electrical conductors N, G, L1, L2 and L3 which are contained within and supported by an electrically insulative member 20. The elongate, flat conductors N, G, L1, L2 and L3 are parallel and spaced apart. An electrically conductive or metallic shield member 22 extends lengthwise of the multiconductor cable 12 overlying the insulative support and casing member 20. The metallic shield 22 is made from a thin sheet of electrically conductive material, such as copper and the conductors N, G, L1, L2 and L3 are preferably made from the same metal to prevent galvanic corrosion therebetween. The metallic shield 22 is mechanically and electrically connected to the ground conductor G, for example, such as at regular intervals along the length of the multiconductor cable 18 such as by a plurality of welds 23 or by a plurality of spaced apart fastener devices 23 such as rivets. Alternatively, the metallic shield 22 is mechanically and electrically connected to the ground conductor G at the transition point with the external AC power source and at each power outlet with the load device to be protected. Multiconductor cable 18 is arranged to provide a low impedance. The multiconductor cable 18 provides a distributed capacitance between each of the live conductors L1, L2, L3 and ground and the neutral conductor and ground as a result of the arrangement of the electrically grounded, flat shield member 22. The distributed cable capacitance schematically shown in FIG. 1 as C1, C2, C3 and CN functions as the shunt capacitance element for the filter and suppression circuit 10. Additionally, discrete shunt capacitance devices can be connected in parallel with the distributed cable capacitance C1, C2, C3 and CN.

Transient voltage suppression circuitry 12 includes a plurality of transient voltage suppressor devices 24 connected between a common node 25 and each of the live conductor lines L1, L2 and L3 and neutral line N. A series connected transient voltage suppressor device 26 and a gas discharge tube 28 are connected between the common node 25 and the ground line G. Various known devices that are rated for high voltage and current applications can be used for the transient voltage suppressor devices 24 and 26, for example, such as silicon P-N junction devices. The gas discharge tube 28 provides a high impedance to ground. In particular, such protection circuitry as is described in U.S. Pat. No. 4,455,586 issued June 19, 1984 is useful for the transient voltage suppressor circuitry 12. The disclosure of the above referenced patent is incorporated herein by reference.

Referring now to FIG. 2, the novel series inductance element 14 of the circuit 10 includes a plurality of substantially identical coils 30 shown as L1', L2', L3', N1, N2 and N3 arranged as shown on a common magnetic core 32. Inductance coils 30 can be wound in a conventional manner in a plurality of layers. Inductance coils 30 are series-connected between the external power source (not shown) and the multi-conductor cable 18. The inductance coils 30 preferably are arranged as illustrated in FIG. 1 to maximize the leakage inductance between the coils 30. This gives the coils 30 the maximum normal mode performance. Coils L1' and N1 have opposite polarity for cancelling the magnetic flux in the magnetic core 32. Likewise, inductor coils L2' and N2 and L3' and N3 are similarly arranged. In the illustrated arrangement, coils 30 can be arranged to provide, for example, such as, a common mode inductance reference to ground of 0.640 mH and a normal mode inductance reference to neutral of 0.036 mH. A common mode current (i.e., a current going through any coil L1'-L3' and N1-N3 and returning through ground G) creates the maximum inductance value in the core 32 since there is no cancellation of the magnetic fluxes. A normal mode current (i.e., a current going through any live coil L1', L2', L3' and returning through its corresponding neutral coil N1, N2 and N3) results in a cancellation of fluxes in the core 32, leaving the leakage field between these coils to form the normal mode inductance. The important factor in having the normal mode inductance consisting of only the leakage field, is that since the leakage field cannot saturate (even under high load surge currents), the normal mode inductance is always a consistent value. This is true not only for the current that flows through a live coil L1', L2' and L3' and returns through its corresponding neutral coil N1, N2 and N3, but also for the current that flows through one live coil, such as coil L1' and returns through another live coil, such as L2'. A magnetic path for each of the live and neutral inductance coils 30 has the same direction indicated by an arrow 34. The common magnetic core 32 preferably is a U-I configuration formed of relatively thin, high permeability, interleaved laminations.

Filter circuitry 16 provides for normal mode filtering between the live and neutral lines. Snubber filter circuitry 16 includes a capacitor 36 connected between each of the live lines L1, L2 and L3 and neutral line N. A series connected resistor 38 and capacitor 40 is connected in parallel with each of the capacitors 36.

In summary, the disclosed electrical filter and suppression circuit 10 provides effective protection to a plurality of different load devices (not shown) that can be connected along the length of the multi-conductor cable 18, thus eliminating the need for a separate protection circuit at each power outlet with each load device to be protected.

Although the present invention has been described in connection with details of the preferred embodiment, many alterations and modifications may be made without departing from the invention. Accordingly, it is intended that all such alterations and modifications be considered within the spirit and scope of the invention as defined in the appended claims.

What is claimed and desired to be secured by Letters Patent of the United States is:

1. An electrical filter for protecting a plurality of different load devices connected to an AC branch power distribution system supplied from a common external AC power source comprising:
   a plurality of elongate, flat conductors coupled to said AC power source including a neutral conductor, a ground conductor and at least one live conductor, said elongate flat conductors being parallel and spaced apart in an electrically insulative casing member;
   an electrically conductive shield member electrically connected to said ground conductor and extending lengthwise of said flat conductors and overlying said insulative casing member; and
   transition filtering means connecting said elongate flat conductors and said common AC power source, said transition filtering means including an inductance device connected in series with each of said live conductors and said neutral conductor.

2. An electrical filter as recited in claim 1 wherein said transition filtering means include a plurality of inductors arranged on a common magnetic core.

3. An electrical filter as recited in claim 2 wherein said plurality of inductors are identical and said series connected neutral conductor inductance device has an opposite polarity as said series connected live conductor inductance device for maximizing inductance values.

4. An electrical filter as recited in claim 1 wherein said transition filtering means further includes a capacitor connected between each of said live conductors and said neutral conductor.

5. An electrical filter as recited in claim 1 wherein said transition filtering means further includes a series connected resistor and capacitor connected between each of said live conductors and said neutral conductor.

6. An electrical filter as recited in claim 1 wherein said transition filtering means further includes a first capacitor connected between each of said live conductors and said neutral conductor and a series connected resistor and second capacitor connected in parallel with said first capacitor.

7. An electrical filter as recited in claim 1 wherein said transition filtering means further includes a plurality of transient voltage suppressors connected between a common node and each of said live conductors and said neutral conductor and a series connected transient voltage suppressor and a gas discharge tube connected between said common node and said ground conductor.

8. An AC branch power distribution network for supplying AC power to a plurality of different load devices from a common external AC power source comprising:
   a plurality of elongate, flat conductors coupled to said AC power source and including a neutral conductor, a ground conductor and at least one live conductor, said flat conductors being parallel and spaced apart in electrically insulative casing member;
   an electrically conductive shield member electrically connected to said ground conductor and extending lengthwise of said flat conductors and overlying said insulative casing member, said shield member providing a shunt capacitance between each of said live conductors and ground and between said neutral conductor and ground; and
   transition filtering means connected between said plurality of elongate flat conductors and said power source including an inductance device connected in series with each of said live conductors and said neutral conductor.

9. An AC branch power distribution network as recited in claim 8 wherein said transition filtering means include a plurality of inductors arranged on a common core.

10. An AC branch power distribution network as recited in claim 9 wherein said plurality of inductors are identical and said series connected neutral conductor inductance device has an opposite polarity as said series connected live conductor inductance device for maximizing inductance values.

11. An AC branch power distribution network as recited in claim 8 wherein said transition filtering means further includes a capacitor connected between each of said live conductors and said neutral conductor.

12. An AC branch power distribution network as recited in claim 8 wherein said transition filtering means further includes a series connected resistor and capacitor connected between each of said live conductors and said neutral conductor.

13. An AC branch power distribution network as recited in claim 8 wherein said transition filtering means further includes a first capacitor connected between each of said live conductors and said neutral conductor and a series connected resistor and second capacitor connected in parallel with said first capacitor.

14. An AC branch power distribution network as recited in claim 8 wherein said transition filtering means further includes a plurality of transient voltage suppressors connected between a common node and each of said live conductors and said neutral conductor and a series connected transient voltage suppressor and a gas discharge tube connected between said common node and said ground conductor.

15. An electrical filter for protecting a plurality of different load devices connected to an AC branch power distribution system supplied from a common AC power source comprising:
   a plurality of elongate, flat conductors coupled to said AC power source including a neutral conductor, a ground conductor and at least one live conductor, said elongate flat conductors being parallel and spaced apart in an electrically insulative casing member;
   an electrically conductive shield member electrically connected to said ground conductor and extending lengthwise of said flat conductors and overlying said insulative casing member; and
   transition filtering means connecting said elongate flat conductors and said common AC power source, said transition filtering means including a plurality of identical inductance coils disposed on a common magnetic core; one of said inductance coils connected in series with each of said live conductors with a corresponding oppositely poled inductance coil connected in series with said neutral conductor.

16. An electrical filter as recited in claim 15 wherein said transition filtering means further includes a capacitor connected between each of said live conductors and said neutral conductor.

17. An electrical filter as recited in claim 15 wherein said transition filtering means further includes a series connected resistor and capacitor connected between each of said live conductors and said neutral conductor.

18. An electrical filter as recited in claim 15 wherein said transition filtering means further includes a first capacitor connected between each of said live conductors and said neutral conductor and a series connected resistor and second capacitor connected in parallel with said first capacitor.

19. An electrical filter as recited in claim 15 wherein said transition filtering means further includes a plurality of transient voltage suppressors connected between a common node and each of said live conductors and said neutral conductor and a series connected transient voltage suppressor and a gas discharge tube connected between said common node and said ground conductor.

20. An electrical filter as recited in claim 15 wherein said transition filtering means further includes a discrete capacitance device connected in parallel with a distributed shunt capacitance between each of said live conductors and ground and between said neutral conductor and ground.

* * * * *